US011296491B2

(12) United States Patent
Elliott (10) Patent No.: US 11,296,491 B2
(45) Date of Patent: Apr. 5, 2022

(54) METHOD AND APPARATUS FOR OPERATING A POWER DISTRIBUTION SYSTEM

(71) Applicant: GE Aviation Systems Limited, Cheltenham (GB)

(72) Inventor: David Alan Elliott, Gloucestershire (GB)

(73) Assignee: GE Aviation Systems Limited, Cheltenham (GB)

( * ) Notice: Subject to any disclaimer, the term of this patent is extended or adjusted under 35 U.S.C. 154(b) by 43 days.

(21) Appl. No.: 16/812,794

(22) Filed: Mar. 9, 2020

(65) Prior Publication Data

US 2020/0313419 A1    Oct. 1, 2020

(30) Foreign Application Priority Data

Mar. 25, 2019    (GB) .................................... 1904110

(51) Int. Cl.
*G01R 19/165*    (2006.01)
*G05F 3/18*    (2006.01)
(Continued)

(52) U.S. Cl.
CPC ......... *H02H 3/22* (2013.01); *G01R 19/16523* (2013.01); *G05F 1/571* (2013.01);
(Continued)

(58) Field of Classification Search
CPC ..... B64D 2221/00; G05F 1/569; G05F 1/571; G05F 3/18; G01R 19/16523; H02H 3/325;
(Continued)

(56) References Cited

U.S. PATENT DOCUMENTS 5,856,904 A    1/1999  Pelly et al.
7,626,797 B2 * 12/2009  Kilroy ...................... H02H 9/04
                                                     361/93.4
(Continued)

FOREIGN PATENT DOCUMENTS

CN    101567549 A    10/2009
DE    10065040 A1    6/2002
(Continued)

OTHER PUBLICATIONS

Kansuke Fujii et al., "STATCOM Applying Flat-Packaged IGBT's Connected in Series", IEEE Transactions on Power Electronics, vol. 20, No. 5, Sep. 2005, 8 pages, presented in Aachen, Germany.
(Continued)

*Primary Examiner* — Scott Bauer
*Assistant Examiner* — Sisay G. Tiku
(74) *Attorney, Agent, or Firm* — McGarry Bair PC (57) ABSTRACT

A method and apparatus for operating a power distribution system, includes providing a solid state switch downstream of a power source and upstream of an electrical load, the solid state switch operable in a conducting mode that enabling conduction from upstream to the output and a non-conducting mode that disables conduction from the input to the output, and providing a transient voltage suppressor defining a breakdown voltage upstream of the solid state switch.

16 Claims, 5 Drawing Sheets

(51) Int. Cl.
  *G05F 1/571* (2006.01)
  *H02H 3/32* (2006.01)
  *H02H 9/00* (2006.01)
  *H01L 29/866* (2006.01)
  *H02H 9/04* (2006.01)
  *H02H 9/02* (2006.01)
  *H02H 3/22* (2006.01)
  *H02H 3/087* (2006.01)
  *H02J 1/08* (2006.01)
  *H03K 17/0812* (2006.01)

(52) U.S. Cl.
  CPC .............. *G05F 3/18* (2013.01); *H01L 29/866* (2013.01); *H02H 3/087* (2013.01); *H02H 3/325* (2013.01); *H02H 9/005* (2013.01); *H02J 1/08* (2013.01); *H03K 17/08122* (2013.01); *B64D 2221/00* (2013.01); *H02J 2310/44* (2020.01)

(58) Field of Classification Search
  CPC ........ H02H 9/005; H02H 3/023; H02H 9/041; H02H 9/04; H01L 29/866; H03K 17/08122; H02J 2310/44
  See application file for complete search history.

(56) References Cited

U.S. PATENT DOCUMENTS

| | | | |
|---|---|---|---|
| 8,847,656 B1 | 9/2014 | A et al. | |
| 9,590,412 B2 | 3/2017 | Poulose et al. | |
| 10,020,651 B2 | 7/2018 | Dickey | |
| 10,027,317 B2 | 7/2018 | Handy | |
| 10,401,420 B2* | 9/2019 | Dickey | G01R 31/2607 |
| 10,498,130 B2* | 12/2019 | Handy | H02H 3/025 |
| 10,814,999 B2* | 10/2020 | Elliott | H02J 3/14 |
| 2004/0095699 A1 | 5/2004 | Kohno | |
| 2010/0026253 A1 | 2/2010 | Wang | |
| 2010/0110595 A1 | 5/2010 | Yang et al. | |
| 2010/0259860 A1 | 10/2010 | Souma | |
| 2010/0284114 A1* | 11/2010 | Kilroy | H02H 3/202 361/86 |
| 2013/0329329 A1* | 12/2013 | Liu | H02H 3/18 361/93.1 |
| 2015/0123622 A1* | 5/2015 | Yasui | H02J 1/10 320/162 |
| 2015/0372583 A1* | 12/2015 | Bacaksiz | H02M 3/335 363/16 |
| 2016/0050724 A1* | 2/2016 | Moon | H05B 45/48 315/200 R |
| 2016/0141867 A1 | 5/2016 | Boecker et al. | |
| 2017/0155244 A1 | 6/2017 | Dickey et al. | |
| 2018/0034457 A1* | 2/2018 | Carletti | H03K 17/08104 |
| 2018/0134408 A1 | 5/2018 | Handy | |
| 2018/0167066 A1 | 6/2018 | Elliott | |
| 2019/0027927 A1* | 1/2019 | Chemisky | H05B 45/48 315/200 R |
| 2019/0199091 A1* | 6/2019 | Handy | H02H 7/222 |

FOREIGN PATENT DOCUMENTS

| | | |
|---|---|---|
| EP | 3041101 A1 | 7/2016 |
| WO | 00/11785 A1 | 3/2000 |
| WO | 2017/177429 A1 | 10/2017 |
| WO | 2018050638 A1 | 3/2018 |

OTHER PUBLICATIONS

European Patent Office, Extended European Search Report re Corresponding Application No. 20162006.9-1202, dated Aug. 19, 2020, 9 pages, Munich, Germany.

* cited by examiner

METHOD AND APPARATUS FOR OPERATING A POWER DISTRIBUTION SYSTEM

CROSS REFERENCE TO RELATED APPLICATION(S)

This application claims the benefit of Great Britain Application No. GB 1904110.2, filed Mar. 25, 2019, which is incorporated herein by reference in its entirety.

BACKGROUND

Electrical power systems, such as those found in an aircraft power distribution system, employ power generating systems or power sources, such as generators, for generating electricity for powering the systems and subsystems of the aircraft. As the electricity traverses electrical bus bars to deliver power from power sources to electrical loads, power distribution nodes dispersed throughout the power system ensure the power delivered to the electrical loads meets the designed power criteria for the loads. Power distribution nodes can, for instance, further provide switching operations to selectively enable or disable the delivery of power to particular electrical loads.

BRIEF DESCRIPTION

In one aspect, the present disclosure relates to power distribution system including a solid state switch having an input connected with a power source by a feeder cable having an inductance and an output, the solid state switch operable in a conducting mode that enabling conduction from the input to the output and a non-conducting mode that disables conduction from the input to the output, a transient voltage suppressor connected with the input of the solid state switch and defining a breakdown voltage, and a solid state switch control circuit. The solid state switch control circuit further includes a controller module configured to drive switching operations of the solid state switch between the conducting mode and the non-conducting mode by way of a control output signal, and a voltage clamp component connected to the control output signal and defining a transient voltage clamp value, wherein the voltage clamp component is selected such that an voltage output from the solid state switch is constrained to a predetermined value by way of the transient voltage clamp value. When a rising transient voltage exceeding the voltage clamp value is received by the input of the solid state switch while the solid state switch operating in the conducting mode, the control output signal is limited by way of the voltage clamp value, limiting the voltage output of the solid state switch, and wherein the limiting the voltage output of the solid state switch applies the rising transient voltage to the transient voltage suppressor until the rising transient voltage is greater than that breakdown voltage, enabling the transient voltage suppressor to limit the rising transient voltage.

In another aspect, the present disclosure relates to a voltage regulator circuit for a power distribution system, including a power source, a feeder cable defining an inductance, a solid state switch having an input connected with the power source by the feeder cable and an output, the solid state switch operable in a conducting mode that enabling conduction from the input to the output and a non-conducting mode that disables conduction from the input to the output, a transient voltage suppressor connected with the feeder cable upstream of the solid state switch defining a breakdown voltage, and a solid state switch control circuit. The solid state switch control circuit further includes a controller module configured to drive switching operations of the solid state switch between the conducting mode and the non-conducting mode by way of a control output signal, and a Zener diode connected to control output signal and defining a transient voltage clamp value, wherein the Zener diode is selected such that the Zener diode clamps the maximum control output signal voltage from the controller module. When a rising transient voltage exceeding the transient voltage clamp value is received by the input of the solid state switch while the solid state switch is operating in the conducting mode, the control output signal is limited by the Zener diode, limiting the voltage output of the solid state switch, and wherein the limiting the voltage output of the solid state switch limits the rising transient voltage conducted through the solid state switch until the rising transient voltage is greater than that transient voltage suppressor breakdown voltage, enabling the transient voltage suppressor to limit the rising transient voltage.

In yet another aspect, the present disclosure relates to a method of operating a power distribution system, including providing a solid state switch downstream of a power source and upstream of an electrical load, the solid state switch operable in a conducting mode that enabling conduction from upstream to the output and a non-conducting mode that disables conduction from the input to the output, providing a transient voltage suppressor defining a transient voltage suppressor breakdown voltage upstream of the solid state switch, and, in response to receiving an upstream transient voltage at the solid state switch, limiting the conducting voltage output of the solid state switch to a maximum voltage by a control circuit until at least one of the upstream transient voltage subsides or the upstream transient voltage exceeds the breakdown voltage of the transient voltage suppressor, enabling the transient voltage suppressor to limit the upstream transient voltage.

DETAILED DESCRIPTION

The described aspects of the present disclosure are directed to an electrical power distribution system or power distribution node for an aircraft, which enables production and distribution of electrical power, such as from a gas turbine engine driven generator, to the electrical loads of the aircraft. It will be understood that while aspects of the disclosure are shown in or intended for in-situ use of an aircraft environment, the disclosure is not so limited and has general application to electrical power systems in non-aircraft applications, such as other mobile applications and non-mobile industrial, commercial, and residential applications. Aspects of the disclosure can be further applicable to provide power, supplemental power, emergency power, essential power, or the like, in otherwise non-emergency operations, such as takeoff, landing, or cruise flight operations.

While "a set of" various elements will be described, it will be understood that "a set" can include any number of the respective elements, including only one element.

Non-limiting aspects of the disclosure are directed to limiting the delivering, supplying, providing, or the like, of power from an upstream power source to downstream component, such as an electrical load or power-consuming component. Furthermore, non-limiting aspects of the disclosure primarily describe controlling aspects of the power delivering by way of current-limiting operations. It will be understood that current-limiting operations are merely one example of power delivery control. Non-limiting aspects of the disclosure can include voltage-limiting operations for power delivery control, or a combination of voltage and current-limiting operations.

All directional references (e.g., upstream, downstream, etc.) are only used for identification purposes to aid the reader's understanding of the disclosure, and do not create limitations, particularly as to the position, orientation, or use thereof. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. In non-limiting examples, connections or disconnections can be selectively configured to provide, enable, disable, or the like, an electrical connection between respective elements. In non-limiting examples, connections or disconnections can be selectively configured to provide, enable, disable, or the like, an electrical connection between respective elements. Non-limiting example power distribution bus connections or disconnections can be enabled or operated by way of switching, bus tie logic, or any other connectors configured to enable or disable the energizing of electrical loads downstream of the bus.

As used herein, a "system" or a "controller module" can include at least one processor and memory. Non-limiting examples of the memory can include Random Access Memory (RAM), Read-Only Memory (ROM), flash memory, or one or more different types of portable electronic memory, such as discs, DVDs, CD-ROMs, etc., or any suitable combination of these types of memory. The processor can be configured to run any suitable programs or executable instructions designed to carry out various methods, functionality, processing tasks, calculations, or the like, to enable or achieve the technical operations or operations described herein. The program can include a computer program product that can include machine-readable media for carrying or having machine-executable instructions or data structures stored thereon. Such machine-readable media can be any available media, which can be accessed by a general purpose or special purpose computer or other machine with a processor. Generally, such a computer program can include routines, programs, objects, components, data structures, algorithms, etc., that have the technical effect of performing particular tasks or implement particular abstract data types.

As used herein, a controllable switching element, or a "switch" is an electrical device that can be controllable to toggle between a first mode of operation (e.g. a "conducting" mode), wherein the switch is "closed" intending to transmit or conduct current from a switch input to a switch output, and a second mode of operation (e.g. a "non-conducting" mode), wherein the switch is "open" intending to prevent current from transmitting or conducting between the switch input and switch output. In non-limiting examples, connections or disconnections, such as connections enabled or disabled by the controllable switching element, can be selectively configured to provide, enable, disable, or the like, an electrical connection between respective elements.

Aspects of the disclosure can be implemented in any electrical circuit environment having a switch. A non-limiting example of an electrical circuit environment that can include aspects of the disclosure can include an aircraft power system architecture, which enables production of electrical power from at least one spool of a turbine engine, preferably a gas turbine engine, and delivers the electrical power to a set of electrical loads via at least one solid state switch, such as a solid state power controller (SSPC) switching device. One non-limiting example of the SSPC can include a silicon carbide (SiC) or Gallium Nitride (GaN) based, high power switch. SiC or GaN can be selected based on their solid state material construction, their ability to handle high voltages and large power levels in smaller and lighter form factors, and their high speed switching ability to perform electrical operations very quickly. Additional switching devices or additional silicon-based power switches can be included. SSPCs can further include operational functionality including, but not limited to, current limiting, overcurrent protection, trip functions (i.e. opening the switchable element in response to a value out of expected range), or the like.

The exemplary drawings are for purposes of illustration only and the dimensions, positions, order and relative sizes reflected in the drawings attached hereto can vary.

Figure 1:
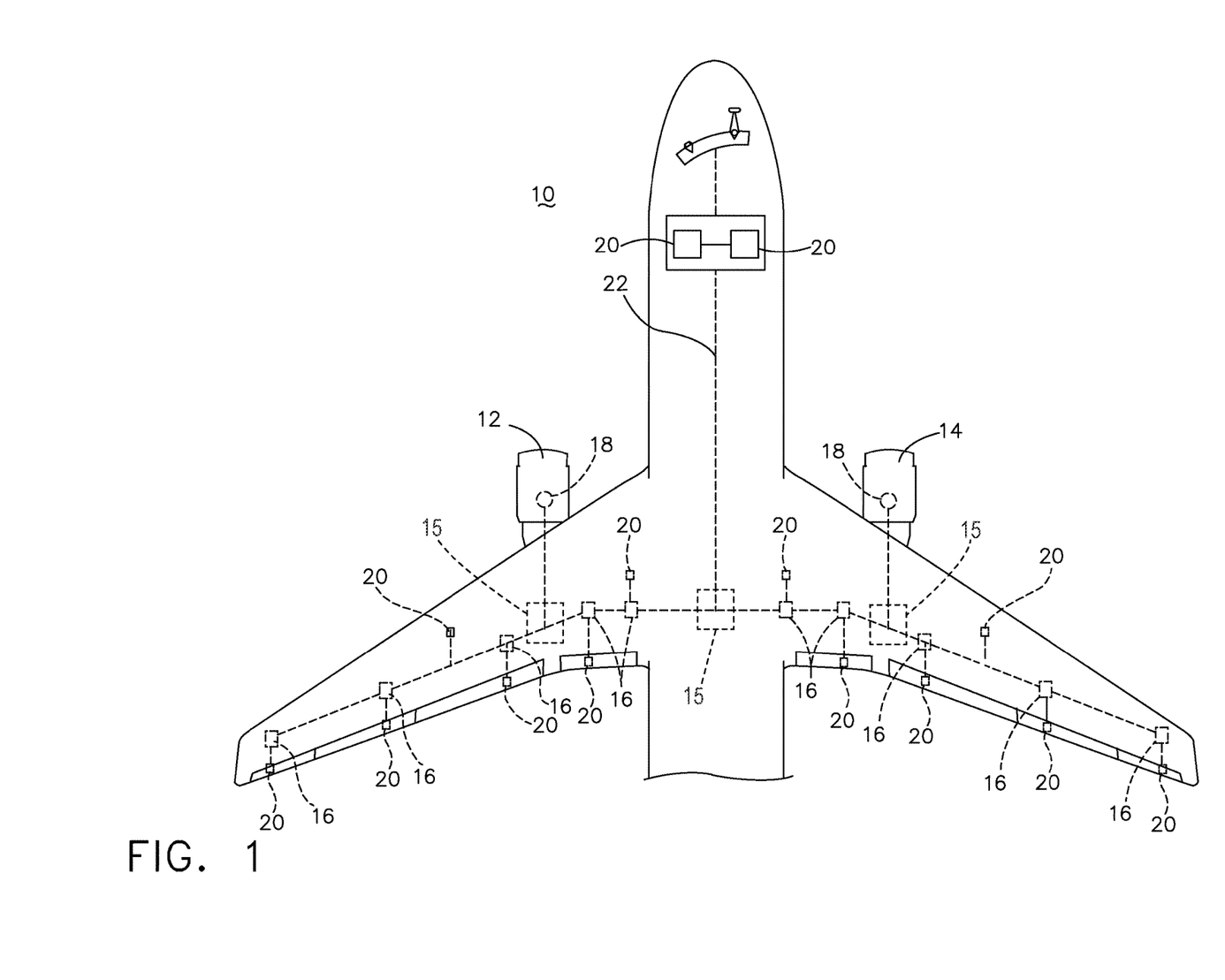
FIG. 1 is a top down schematic view of an aircraft and power distribution system in an aircraft in accordance with various aspects described herein.

As illustrated in FIG. 1, an aircraft 10 is shown having at least one engine, most commonly a turbine engine, shown as a left engine system 12 and a right engine system 14. Alternatively, the power system can have fewer or additional engine systems. The left and right engine systems 12, 14 can be substantially alike or identical, and can further include at least one power source, such as an electric machine or a generator 18 in each respective engine system 12, 14. While one generator 18 is schematically illustrated, aspects of the disclosure can be included wherein a set of generators are utilized for power generation, for example, at a single engine system 12, 14.

The aircraft is shown further having a set of power-consuming components, or electrical loads 20, such as for instance, an actuator load, flight critical loads, and non-flight critical loads. The electrical loads 20 are electrically coupled with at least one of the generators 18 via a power distribution system including, for instance, power transmission lines 22, conductors, bus bars, a set of power distribution nodes 15, 16, or the like. For example, the power distribution nodes 15, 16 can include primary power distribution nodes 15 and secondary power distribution nodes 16. In one non-limiting example, the primary power distribution nodes 15 can include switchable operations for delivering power from the power sources or generators 18 to large electrical loads 20 or to a set of secondary power distribution nodes 16. While primary and secondary power distribution nodes 15, 16 are shown and described, any number of hierarchical distribution node arrangements can be included.

It will be understood that the illustrated aspects of the disclosure of FIG. 1 is only one non-limiting example of a power distribution system, and many other possible aspects and configurations in addition to that shown are contemplated by the present disclosure. Furthermore, the number of, and placement of, the various components depicted in FIG. 1 are also non-limiting examples of aspects associated with the disclosure.

In the aircraft 10, the operating left and right engine systems 12, 14 provide mechanical energy which can be extracted, typically via a turbine engine spool, to provide a driving force for the generator 18. The generator 18, in turn, generates power, such as direct current (DC) power or alternating current (AC) power, and provides the generated power to the transmission lines 22. In non-limiting aspects of the disclosure, the transmission lines 22, or power distribution nodes 15, 16 connected therewith, can, for example, provide switching, power conversion, or distribution management functions, as needed, in order to provide the desired electrical power to the electrical loads 20 for load operations.

Example power distribution management functions can include, but are not limited to, selectively enabling or disabling the delivery of power to particular electrical loads 20, depending on, for example, available power distribution supply, criticality of electrical load 20 functionality, or aircraft mode of operation, such as take-off, cruise, or ground operations. Additional management functions can be included. Furthermore, additional power sources for providing power to the electrical loads 20, such as emergency power sources, ram air turbine systems, starter/generators, or batteries, can be included, and can substitute for the power source. It will be understood that while one aspect of the disclosure is shown in an aircraft environment, the disclosure is not so limited and has general application to electrical power systems in non-aircraft applications, such as other mobile applications and non-mobile industrial, commercial, and residential applications.

Figure 2:
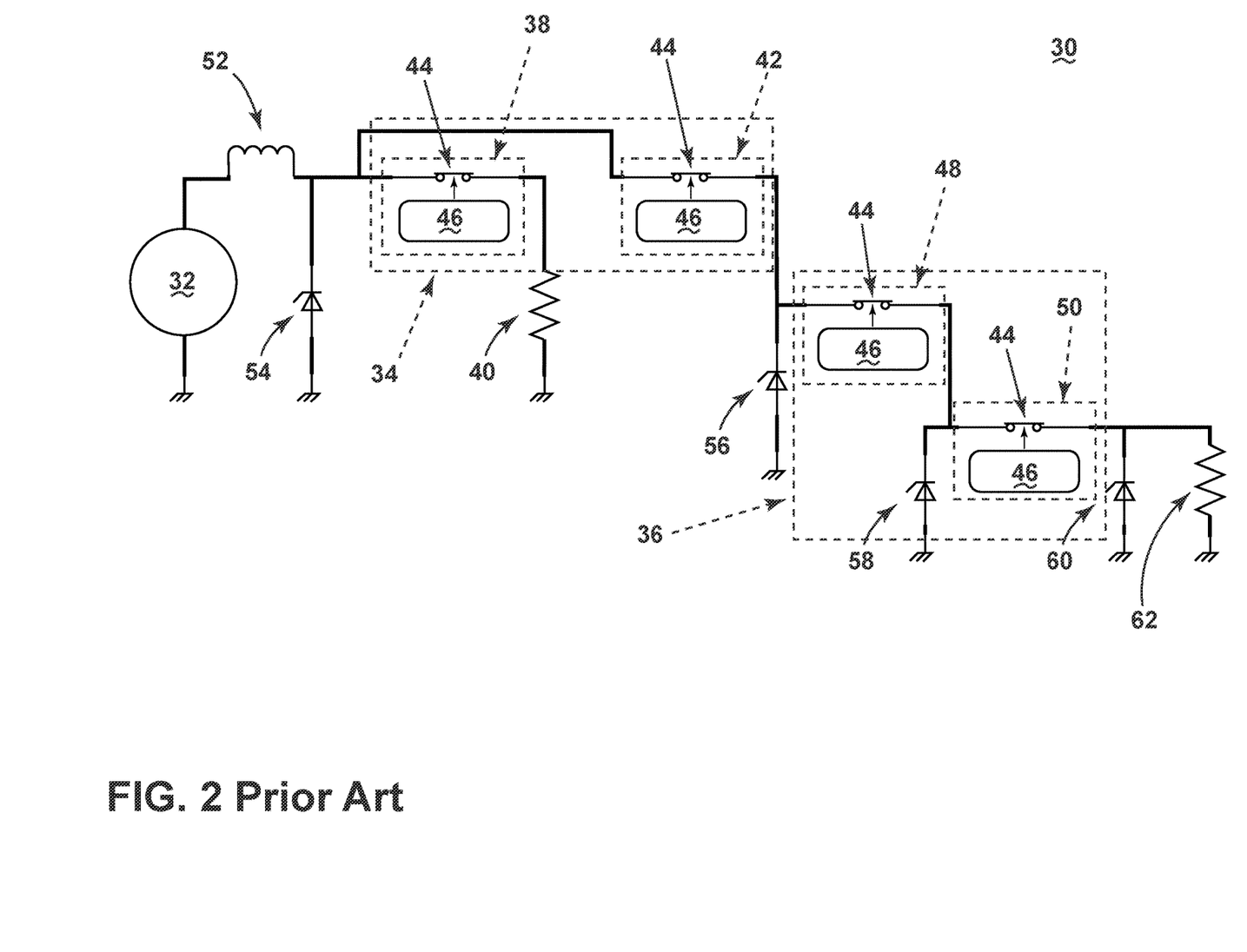
FIG. 2 illustrates an example schematic view of a prior art power distribution system.

FIG. 2 illustrates a prior art schematic example of a power distribution system 30. As shown, an example power supply 32 is connected with primary power distribution node 34, which is further connected with a secondary power distribution node 36. The primary power distribution node 34 includes a first power switch 38 and a second power switch 42 connected in parallel with the power supply 32. The first power switch 38 is further connected with a large electrical load 40, such as a motor. As used herein, "large" refers to an electrical load having relatively high power requirements. The second power switch 42 is further connected with the secondary power distribution node 36. The secondary power distribution node 36 also includes a third power switch 48 further connected with a fourth power switch 50. The fourth power switch 50 is shown further connected with a relatively small electrical load 62.

Each power switch 38, 42, 48, 50 includes a switch 44 and a switch controller 46, whereby the switch 44 operates to open or close in response to instruction from the switch controller 46. The power distribution system 30 further includes a set of transient voltage suppressors (TVS), shown as a first TVS 54 positioned upstream of the primary power distribution node 34, a second TVS 56 positioned between the primary power distribution node 34 and the secondary power distribution node 36, a third TVS 58 positioned between the third power switch 48 and the fourth power switch 50, and a fourth TVS 60 positioned downstream of the secondary power distribution node 36. The power distribution system 30 includes feeder lines delivering the power supply 32 output to the primary power distribution node 34, which are schematically illustrated as an inductance 52.

During operation of the power distribution system 30, switching a high current flowing through a conductor in a power distribution circuit results in a large power transient in another part of the same distribution circuit that is responsible for supplying a low power load and hence ill-suited to handle the large power transient. If all the power switches are closed (e.g. in conducting mode), and the first power switch 38 is opened, disconnecting the large electrical load 40, a transient voltage is created in the power distribution system 30 due to the inductance 52. Aircraft power distribution systems 30 are required to ensure their performance is compatible with distributing power to electrical systems which meet appropriate international standards such as the RTCA DO-160G and MIL-HDBK-704F.

When the opening of the first power switch 38 is very fast (such as 1 microsecond), voltage across the inductance 52 will rise until it reaches a value which will allow the current to continue flowing, which involves breakdown of components or insulation of the power distribution system 30. In the prior art, the use of the TVS components 54, 56, 58, 60 provides a transient voltage suppression pathway. However, TVS component 54, 56, 58, 60 variances, such as due to manufacturing variations or tolerances, device temperature, current flow or the like, results in unintended transient voltage operations. If each of the first TVS 54 and second TVS 56 has a breakdown voltage of 350 volts plus or minus 25 volts, it is possible the actual breakdown voltage of the second TVS 56 is less than the breakdown voltage of the first TVS 54 (e.g. the second TVS 56 breakdown voltage is 325 volts while the first TVS 54 breakdown voltage is 375 volts).

The rising transient voltage due to the inductance 52 will continue to rise until the lesser breakdown voltage is reached. Thus, when the rising transient voltage reaches 325 volts, the second TVS 325 will suppress the transient voltage, which will effectively deliver high currents (potentially higher than desirable) through the conducting second power switch 42. The high currents, in turn, trip or damage the second power switch. It is further envisioned that in some instances, the transient voltage is carried through the primary power distribution node 34 and the secondary power distribution node 36 until reaching the lowest breakdown voltage of the set of TVS components 54, 56, 58, 60. This, in turn, trips or damages any or all of the power switches 42, 48, 50 in the conductive pathway, especially when the downstream power switches 48, 50 are designed or rated for lower current or voltage capabilities.

Figure 3:
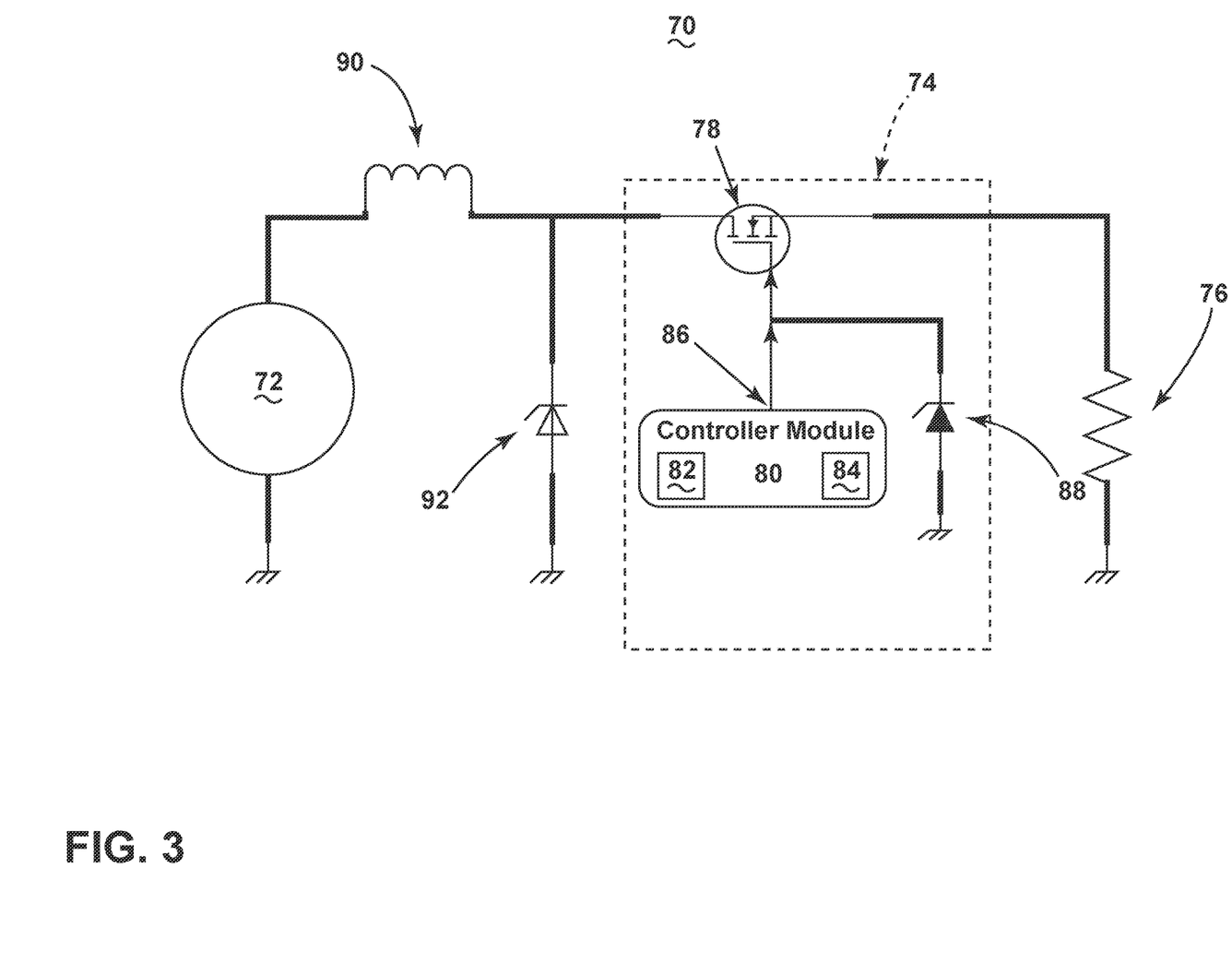
FIG. 3 illustrates a schematic view of the power distribution system of FIG. 1, in accordance with various aspects described herein.

FIG. 3 illustrates a power distributions system 70 in accordance with aspects of the disclosure, including but not limited to, the aspects of FIG. 1. As shown, the power distribution system 70 includes a power source 72 or power supply connected with a power switch 74. In one non-limiting example, the power switch 74 can include a solid state power switch or solid state power controller, as described herein. The power switch 74 can be further connected with a representative electrical load 76. The power switch 74 can include a solid state switchable element 78 and a controller module 80. Non-limiting examples of the solid state switchable element 78 can include silicon-based, silicon carbide-based, gallium nitride-based, or the like, metal-oxide-semiconductor field-effect transistors (MOSFETs), an insulated-gate bipolar transistor, or another high-speed solid state device, as described herein. The controller module 80 can include a processor 82 and memory 84, and be configured, enabled, or the like, to generate a control output signal 86 that is provided to the solid state switchable element 78. The power distribution system 70 can also include a TVS 92 defining a breakdown voltage, and positioned upstream of the power switch 74. While an n-type MOSFET is shown, additional solid state switchable element 78 types can be included.

Since, the high current solid state switchable elements 78 are also able to switch extremely quickly (e.g. between conductive and non-conductive states), they can create high voltage transients at very high current levels that must be carefully controlled and coordinated to prevent them overwhelming connected low power circuits.

In this sense, the solid state switchable element 78 is operable in response to the control output signal 86 of the controller module 80. In addition to the controller module 80 and the control output signal 86, the power switch 74 can include a clamp component adapted or configured to limit a maximum voltage. In one non-limiting example, the voltage clamp component can include a diode, such as a Zener diode 88, defining a reverse-breakdown voltage or a voltage clamp value, but additional electrical components providing voltage clamping functionality can be included. Thus, in the instance where the conduction of current through the solid state switchable element 78 is controlled by the voltage of the control output signal 86, the Zener diode 88 can act as a voltage regulator to ensure that the control output signal 86 does not exceed the voltage clamp value, and thus, acts to limit or control the maximum control output signal 86 delivered or provided to the solid state switchable element 78. Stated another way, the output voltage from the solid state switchable element 78 (source connection) is the lower of its input (drain) voltage and its control (gate) voltage (e.g. the maximum control output signal 86, which is limited by the Zener diode 88). By limiting the maximum control output signal 86, the control output signal 86 further acts to limit or control the variable current and conducting voltage output of the power switch 74. While MOSFETs are described, alternative components could be selected to produce a similar voltage regulation by way of the control output signal 86, or another circuit for limiting or clipping a maximum voltage conducted by the solid state switchable element 78. For example, alternative solid state switchable elements 78 can include utilizing depletion field-effect transistors (FETs) or insulated-gate bipolar transistors (IGBTs), wherein the aspects of the disclosure are still applicable.

In the instance of a rising transient voltage received at the power switch 74, the control output voltage 86 would initially rise in step with the incoming transient voltage to enable the solid state switchable element 78 to conduct the full power to the load. However, if the control output voltage 86 continues to rise, it can reach a value at which the clamping component, such as the Zener diode 88, will limit it to this maximum value. Thus, since the conduction of the power switch 74 would be limiting, the power switch input voltage would continue to rise (but not be carried across the power switch 74) until one of two events would occur: either the input voltage would equal or exceed the breakdown voltage of the TVS 92, enabling the TVS 92 to conduct thereby limiting the transient voltage, or the transient voltage subsides (e.g. the transient period passes) and the power distribution system 70 operates in a "normal" switch mode (e.g. steady state switch mode, unbound by transient voltages). In one non-limiting example, it can be desirable to position the TVS 92 as close as possible to the power switch 74 input to limit the incoming voltage 'seen' or experienced by the power switch 74. If there is an appreciable length of conductor between the TVS 92 and the power switch 74, this conductor will act as an inductance in its own right which can create its own transient voltage. Hence the TVS 92 can be located inside the dotted box outlining the power switch 74, and can be included as part of the power switch 74 rather than the conductor or feeder cable.

In one non-limiting example, at least one of the TVS 92, the Zener diode 88, or both components 88, 92 can be selected to ensure the power switch 74 maximum output voltage (which is set by the Zener diode 88 reverse-breakdown voltage) is less than the TVS 92 breakdown voltage. In another non-limiting example, at least one of the TVS 92, power switch 74 maximum output voltage (which is set by the Zener diode 88), or both components 88, 92 can be selected to ensure a voltage difference between the TVS breakdown voltage and the power switch 74 maximum output voltage (e.g. the voltage applied across the solid state switchable element 78) is acceptable, manageable, thermally tolerable, or the like (e.g. less than a predetermined voltage value or voltage and time pulse that would otherwise damage or potentially damage the solid state switchable element, "a damaging value"), for the expected period of time that the power switch 74 is in the limited conduction mode. In one specific non-limiting example, wherein the power distribution system 70 is distributing 270 volts direct current (DC), a transient voltage, such as an acceptable maximum output voltage during the transient, can include a voltage greater than a predetermined voltage range, such as greater than 300 volts DC (plus or minus 10 volts DC). In this example, the Zener diode 88 can include a reverse-breakdown voltage chosen to limit the maximum output voltage of the power switch 74 to the range of 290 to 310 volts. Likewise, in this example, the TVS 92 can include a breakdown voltage range of 325 to 375 volts, for instance to avoid overlapping the maximum output voltage of the power switch 74 set by the Zener diode 88 voltage breakdown range and limit the voltage across the power switch 74. Furthermore, in this example, the at least one of the Zener diode 88 or TVS 92 can be selected to ensure the limited voltage across the power switch 74 can be dissipated by the solid state switchable element 78 during the transient period. In the above-mentioned example, the solid state switchable element 78 can dissipate 85 volts (the difference between the TVS 92 maximum range of 375 volts and the power switch 74 output voltage of 290 volts controlled by the Zener diode 88 minimum breakdown voltage range). Other non-limiting examples can be included.

Figure 4:
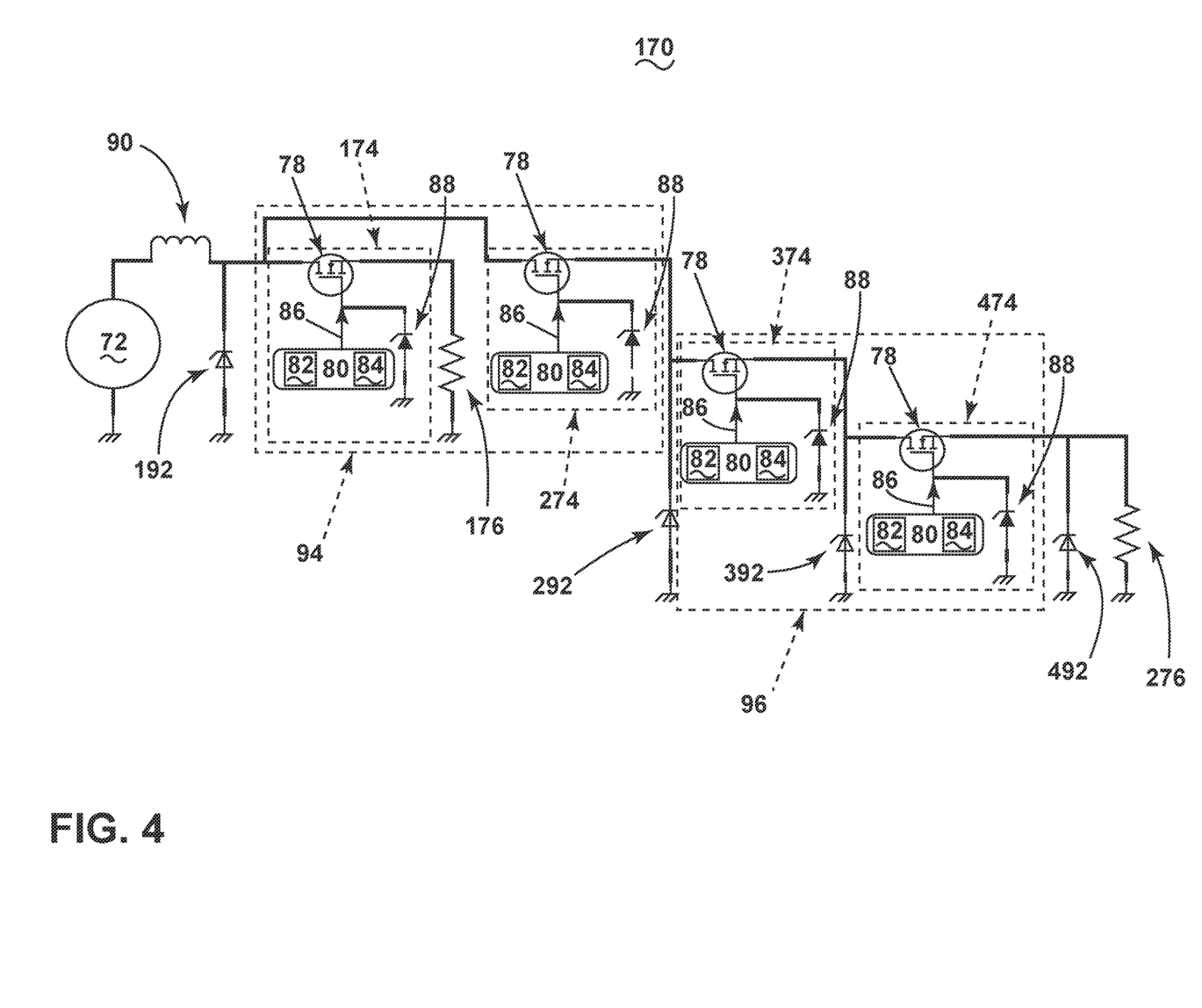
FIG. 4 illustrates another example schematic view of a power distribution system of FIG. 1, in accordance with various aspects described herein.

FIG. 4 illustrates another power distribution system 170 in accordance with aspects of the disclosure. The power distribution system 170 is similar to the power distribution system 70; therefore, like parts will be identified with like numerals increased by 100, 200, 300, etc., with it being understood that the description of the like parts of the power distribution system 70 applies to the power distribution system 170, unless otherwise noted.

As shown, the power distribution system 170 can include a primary distribution node 94 having a first power switch 174 and a second power switch 274 arranged in parallel. The first power switch 174 can switchably control the energization of a first large electrical load 176, such as a motor. The second power switch 274 can be further connected with a secondary distribution node 96 further comprising a third power switch 374 upstream of a fourth power switch 474. The fourth power switch 474 can be further switchably connected with a second electrical load 276.

The power distribution system 170 can also include a first TVS 192 positioned upstream of the primary power distribution node 94, a second TVS 292 positioned between the primary power distribution node 94 and the secondary power power distribution node 96, a third TVS 392 positioned between the third power switch 374 and the fourth power switch 474, and a fourth TVS 492 positioned downstream of the secondary power distribution node 96. As noted here, the precise positioning of the set of TVS components 192, 292, 392, 492 illustrated is non-limiting.

As described herein, the positioning of the set of TVS components 192, 292, 392, 492, as well as the selected set of Zener diodes 88 of the respective set of power switches 174, 274, 374, 474 can allow for a cascading arrangement of voltage regulation in the power distribution system 170, wherein a number of TVS components 192, 292, 392, 492 can be utilized to ensure voltage limiting operations. For instance, the description with respect to FIG. 3 is equally applicable for any of the first, second, third, or fourth power switches 174, 274, 374, 474, and the selection of the Zener diode relative to the upstream and downstream related TVS 192, 292, 392, 492 can be arranged, chosen, selected, related, or the like, such that the transient voltage can be suppressed regardless of where it occurs in the power distribution system.

Furthermore, while the transient voltage has been described with respect to a transient voltage caused by the switchable operation of an upstream power switch, aspects of the disclosure can be applied to power distribution systems 70, 170 experiencing transient voltages from additional or alternative sources. For example, if an electrical fault occurs in one or both of the first power switch 174 or the first electrical load 176, the first power switch 174 may conduct a large fault current or fault voltage delivered through the inductance 90 prior to "tripping" the first power switch 174 (e.g. switchably operating the solid state switchable element 78 of the first power switch 174 to the non-conductive state), which will then continue to carry the transient voltage through the remainder of the power distribution system 170 after the tripping of the first power switch 174. This electrical fault transient voltage can also be suppressed or otherwise accounted for utilizing aspects of the Zener diodes 88, control output signal 86, and voltage regulation or current limiting aspects of the disclosure.

For brevity of describing aspects of the disclosure, it will be understood that the components shown in FIG. 3 and FIG. 4 have schematically representative simple or ideal electrical characteristics, such as understanding that the maximum output voltage of the solid state switch 78 is defined by, and equal to, the breakdown voltage of the Zener diode 88 connected to its gate. It will be understood that deviations between characteristics of practical or "real world" circuit devices and the simple ideal devices can result in adjustments in circuit design or the like, to achieve the described results. For example, while at least one of the TVS 92, the Zener diode 88, or both components 88, 92 is described herein as selected to ensure the power switch 74 maximum output voltage (which is set by the Zener diode 88 reverse-breakdown voltage) is less than the TVS 92 breakdown voltage, it will be understood that the Zener diode 88 controls the maximum output voltage of the power switch 74, but that the Zener diode 88 reverse-breakdown voltage may not necessarily be equal (e.g. in magnitude) to the maximum output voltage of the power switch 74 due to practical (e.g. "real world") circuit device design or operation.

Figure 5:
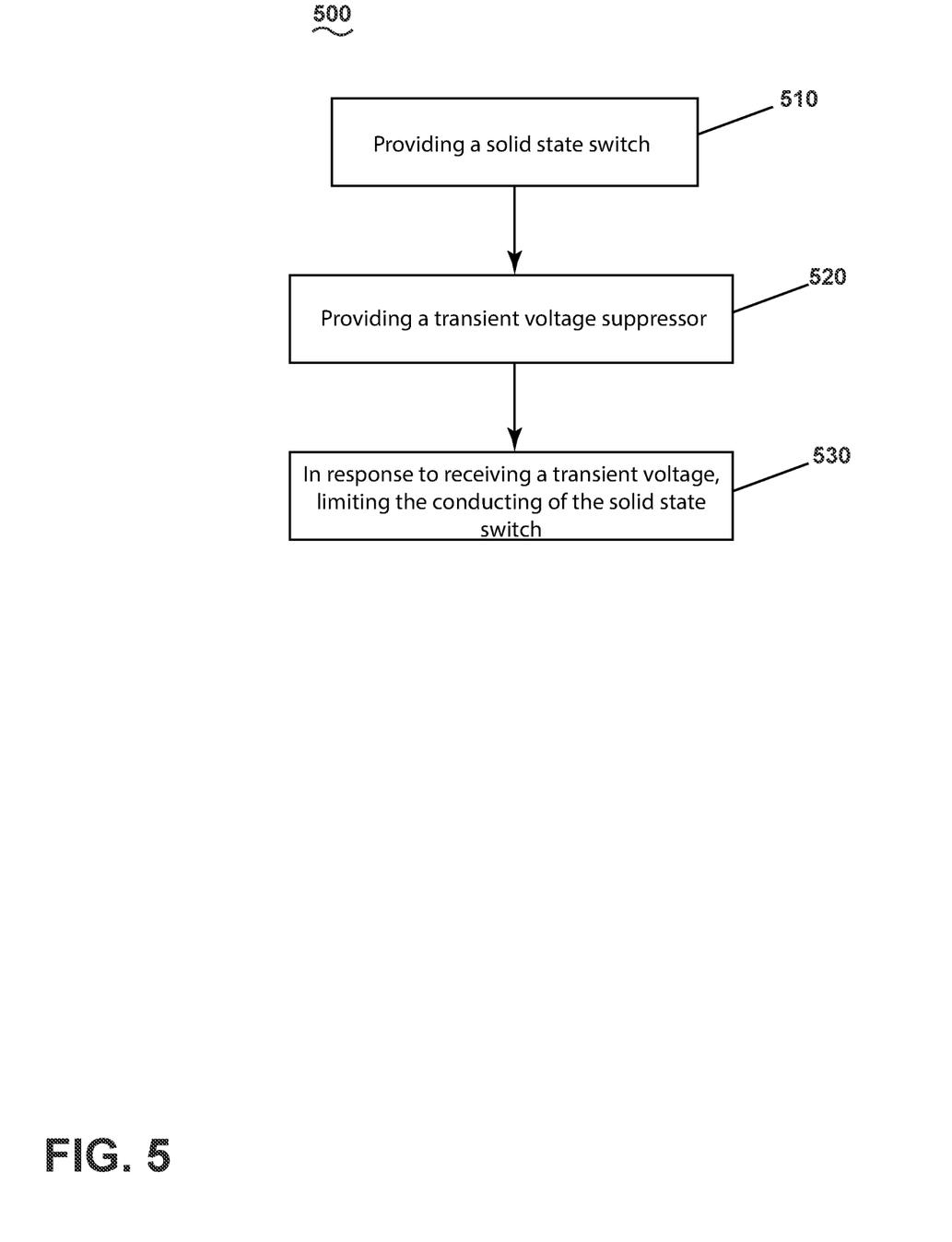
FIG. 5 is diagram of demonstrating a method of operating the power distribution system in accordance with various aspects described herein.

FIG. 5 illustrates a flow chart demonstrating a method 500 of operating a power distribution system 70, 170. The method 500 can include providing a solid state switch 74, 174, 274, 374, 474 downstream of a power source 72 and upstream of an electrical load 76, 176, 276, the solid state switch 74, 174, 274, 374, 474 operable in a conducting mode that enabling conduction from the power source 72 to the electrical load 76, 176, 276 and a non-conducting mode that disables conduction from power source 72 to the electrical load 76, 176, 276, at 510. Next, the method 500 includes providing a transient voltage suppressor 92, 192, 292, 392 defining a breakdown voltage upstream of the solid state switch 74, 174, 274, 374, 474, at 520. Finally, in response to receiving an upstream transient voltage at the solid state switch 74, 174, 274, 374, 474, limiting the conducting voltage output of the solid state switch 74, 174, 274, 374, 474 to a maximum voltage by a control circuit (such as the controller module 80 and Zener diode 88) until at least one of the upstream transient voltage subsides or the upstream transient voltage exceeds the breakdown voltage of the transient voltage suppressor 92, 192, 292, 392, enabling the transient voltage suppressor 92, 192, 292, 392 to limit the upstream transient voltage, at 530.

The sequence depicted is for illustrative purposes only and is not meant to limit the method 500 in any way as it is understood that the portions of the method can proceed in a different logical order, additional or intervening portions can be included, or described portions of the method can be divided into multiple portions, or described portions of the method can be omitted without detracting from the described method. In one non-limiting example, the method 500 can include providing a voltage regulation circuit for the solid state switch 74, 174, 274, 374, 474 including the Zener diode 88 defining a reverse-breakdown voltage. In another non-limiting example, providing the voltage regulation circuit of the method 500 can further include selecting a Zener diode 88 having a reverse-breakdown voltage such that the maximum voltage output from the voltage regulation circuit is less than the breakdown voltage of the transient voltage suppressor 92, 192, 292, 392. In yet another non-limiting example, the method 500 can include selecting the Zener diode 88 wherein the difference between the breakdown voltage of the respective TVS 92, 192, 292, 392 and the reverse-breakdown voltage of the respective Zener diode 88 is less than a predetermined solid state switch 74, 174, 274, 374, 474 damaging voltage, as described herein.

In yet another non-limiting example, the method 500 can further include positioning the Zener diode 88 to clamp a control output signal 86 generated by a controller module 80 and configured to drive switching operations of the solid state switch 74, 174, 274, 374, 474 between the conducting mode and the non-conducting mode. In yet another non-limiting example, the method 500 can include wherein the Zener diode 88 is selected such that the control output signal 86 is clamped at a voltage greater than the maximum control output signal 86 voltage from the controller module 80. In yet another non-limiting example, the method 500 can include limiting the conducting voltage output of the solid state switch 74, 174, 274, 374, 474 to a maximum voltage to operate the solid state switch 74, 174, 274, 374, 474 as a voltage regulator. In yet another non-limiting example, the method 500 can further include providing a set of solid state switches 74, 174, 274, 374, 474 and a set of transient voltage suppressors 92, 192, 292, 392 arranged in cascading levels throughout the power distribution system 70, 170, such as shown in FIG. 4.

Many other possible aspects and configurations in addition to that shown in the above figures are contemplated by the present disclosure. For example, while only the inductance 90 of the conductor from the power source 72 is shown and described, additional inductances (significant or otherwise) can be included. Additionally, while a power source 72 is described, aspects of the disclosure can be included wherein any upstream source of electrical power can be included, such as an upstream power distribution unit, power distribution node, or the like. Additionally, the illustrated aspects of the disclosure are merely one non-limiting schematic example of circuit arrangements to accomplish the described functionality. Full circuit diagrams can include electrical components in addition to those shown, or in place of those shown, while providing similar functionality described. Additionally, the design and placement of the various components can be rearranged such that a number of different in-line configurations could be realized. For example, while a DC power distributions system 70, 170 is shown, one skilled in the art could include aspects of the disclosure in alternating current (AC) power distribution systems by, for example, including back to back solid state switches operating in a similar control schema as described herein.

The aspects disclosed herein provide a method and apparatus for operating a power distribution system or a power distribution node. The technical effect is that the above described aspects enable operations of the power distribution node or system to suppress transient voltages that can occur in the system. One advantage that can be realized in the above aspects of the disclosure is that the above described aspects enable suppressing transient voltages reliably without having to resort to carefully screening and binning components such as TVS components to select required breakdown voltages. Yet another advantage of aspects of the disclosure can include reducing the stress on components both within the power distribution system and within the downstream loads. Yet another advantage of the aspects described herein ensure high power transients caused by switching high currents are prevented from being propagated through the power distribution system to the lower power distribution sections and to the loads. The essence of achieving this aim is that each switch stage is enhanced to include a voltage regulation/clipping function which ensures the stage output voltage remains within 'normal' operation limits. Thus, aspects described can ensure that both the output stage of a "higher tier" of the power distribution system remain within "normal" operation limits, as well as next, subsequent, downstream, or otherwise next "lower tier" of the power distribution system also remains within "normal operation limits.

To the extent not already described, the different features and structures of the various aspects can be used in combination with each other as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

This written description uses examples to disclose aspects of the disclosure, including the best mode, and also to enable any person skilled in the art to practice aspects of the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A power distribution system, comprising:
    a solid state switch having an input connected with a power source by a feeder cable having an inductance and an output, the solid state switch operable in a conducting mode that enables conduction from the input to the output and a non-conducting mode that disables conduction from the input to the output;
    a transient voltage suppressor connected with the input of the solid state switch and defining a breakdown voltage; and
    a solid state switch control circuit, further comprising:
        a controller module configured to drive switching operations of the solid state switch between the conducting mode and the non-conducting mode by way of a control output signal; and
        a voltage clamp component connected to the control output signal and defining a transient voltage clamp value which is less than the transient voltage suppressor breakdown voltage, wherein the voltage clamp component is selected such that a voltage output from the solid state switch is constrained to a predetermined value by way of the transient voltage clamp value;
    wherein, when a rising transient voltage exceeding the voltage clamp value is received by the input of the solid state switch while the solid state switch operates in the conducting mode, the control output signal is limited by way of the voltage clamp value, limiting the voltage output of the solid state switch, and wherein the limiting the voltage output of the solid state switch applies the rising transient voltage to the transient voltage suppressor until the rising transient voltage is greater than the breakdown voltage, enabling the transient voltage suppressor to limit the rising transient voltage.

2. The power distribution system of claim 1 wherein the difference between the transient voltage clamp value and the transient voltage suppressor breakdown voltage is applied to the solid state switch.

3. The power distribution system of claim 2 wherein at least one of the transient voltage suppressor or the voltage clamp component is selected such that the difference between the transient voltage clamp value and the breakdown voltage applied to the solid state switch is less than a predetermined solid state switch damaging voltage.

4. The power distribution system of claim 1 wherein the control output signal controls a variable conduction of current through the solid state switch.

5. The power distribution system of claim 4 wherein the solid state switch operates as a voltage regulator to limit the voltage output of the solid state switch.

6. The power distribution system of claim 1 wherein a set of solid state switches, transient voltage suppressors, and solid state switch control circuits are arranged in cascading levels throughout the power distribution system.

7. The power distribution system of claim 1 wherein the solid state switch includes at least one of a metal-oxide-semiconductor field-effect transistor or an insulated-gate bipolar transistor.

8. The power distribution system of claim 1 wherein the voltage clamp component is selected such that the transient voltage clamp value ensures voltage conducted downstream from the solid state switch is within expected electrical characteristics of at least one downstream electrical component.

9. A voltage regulator circuit for a power distribution system, comprising:
- a power source;
- a feeder cable defining an inductance;
- a solid state switch having an input connected with the power source by the feeder cable and an output, the solid state switch operable in a conducting mode that enables conduction from the input to the output and a non-conducting mode that disables conduction from the input to the output;
- a transient voltage suppressor connected with the feeder cable upstream of the solid state switch defining a breakdown voltage; and
- a solid state switch control circuit, further comprising:
  - a controller module configured to drive switching operations of the solid state switch between the conducting mode and the non-conducting mode by way of a control output signal; and
  - a Zener diode connected to control output signal and defining a transient voltage clamp value, wherein the Zener diode is selected such that the Zener diode clamps a maximum control output signal voltage from the controller module and the transient voltage clamp value of the Zener diode is less than the transient voltage suppressor breakdown voltage;
- wherein, when a rising transient voltage exceeding the transient voltage clamp value is received by the input of the solid state switch while the solid state switch is operating in the conducting mode, the control output signal is limited by the Zener diode, limiting a voltage output of the solid state switch, and wherein the limiting the voltage output of the solid state switch limits the rising transient voltage conducted through the solid state switch until the rising transient voltage is greater than that transient voltage suppressor breakdown voltage, enabling the transient voltage suppressor to limit the rising transient voltage.

10. The power distribution system of claim 9 wherein the difference between the transient voltage clamp value and the transient voltage suppressor breakdown voltage is applied to the solid state switch.

11. A method of operating a power distribution system, comprising:
- providing a solid state switch downstream of a power source and upstream of an electrical load, the solid state switch operable in a conducting mode that enables conduction from upstream to the output and a non-conducting mode that disables conduction from the input to the output;
- providing a transient voltage suppressor defining a transient voltage suppressor breakdown voltage upstream of the solid state switch;
- providing a voltage regulation circuit for the solid state switch including a Zener diode having a reverse-breakdown voltage such that voltage output of the solid switch is less than the breakdown voltage of the transient voltage suppressor; and
- in response to receiving an upstream transient voltage at the solid state switch, limiting conducting voltage output of the solid state switch to a maximum voltage by a control circuit until at least one of the upstream transient voltage subsides or the upstream transient voltage exceeds the breakdown voltage of the transient voltage suppressor, enabling the transient voltage suppressor to limit the upstream transient voltage.

12. The method of claim 11, wherein selecting the Zener diode further comprises selecting the Zener diode wherein the difference between the transient voltage suppressor breakdown voltage and a maximum voltage output, defined by the Zener diode reverse-breakdown voltage, is less than a predetermined solid state switch damaging voltage.

13. The method of claim 11, further comprising positioning the Zener diode to clamp a control output signal generated by a controller module and configured to effect switching operations of the solid state switch between the conducting mode and the non-conducting mode.

14. The method of claim 13 wherein the Zener diode is selected to clamp the control output signal to a voltage less than a minimum breakdown voltage of a downstream second transient voltage suppressor.

15. The method of claim 14 wherein limiting the control output signal of the solid state switch to a less than the minimum breakdown voltage of the downstream second transient voltage suppressor operates the solid state switch as a voltage regulator.

16. The method of claim 11, further comprising providing a set of solid state switches and a set of transient voltage suppressors arranged in cascading levels throughout the power distribution system.

* * * * *

UNITED STATES PATENT AND TRADEMARK OFFICE
CERTIFICATE OF CORRECTION

| | |
|---|---|
| PATENT NO. | : 11,296,491 B2 |
| APPLICATION NO. | : 16/812794 |
| DATED | : April 5, 2022 |
| INVENTOR(S) | : David Alan Elliott |

It is certified that error appears in the above-identified patent and that said Letters Patent is hereby corrected as shown below:

In the Claims

Column 12, Claim 8, Line 65, reads, --The power distribution system of claim 1 wherein the voltage clamp component is selected such that the transient voltage clamp value ensures voltage conducted downstream from the solid state switch is within expected electrical characteristics of at least one downstream electrical component.--

Should read, --The power distribution system of claim 1 wherein the voltage clamp component is selected such that the transient voltage clamp value ensures voltage conducted downstream from the solid state switch output is within expected electrical characteristics of at least one downstream electrical component.--

Signed and Sealed this
Seventeenth Day of May, 2022

Katherine Kelly Vidal
*Director of the United States Patent and Trademark Office*